(12) United States Patent
Jeon et al.

(10) Patent No.: US 11,189,207 B2
(45) Date of Patent: Nov. 30, 2021

(54) CHIP-ON-FILM AND DISPLAY INCLUDING THE SAME

(71) Applicant: LG Display Co., Ltd., Seoul (KR)

(72) Inventors: Jaesung Jeon, Seoul (KR); Daekyung Kim, Ulsan (KR); Eunbyul Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/004,657

(22) Filed: Aug. 27, 2020

(65) Prior Publication Data

US 2020/0394946 A1 Dec. 17, 2020

Related U.S. Application Data

(62) Division of application No. 16/155,705, filed on Oct. 9, 2018, now Pat. No. 10,789,869.

(30) Foreign Application Priority Data

Dec. 28, 2017 (KR) ........................ 10-2017-0182520

(51) Int. Cl.
*G09G 3/20* (2006.01)
*H01L 27/12* (2006.01)
*H05K 1/18* (2006.01)
*H05K 3/32* (2006.01)
*H01L 23/00* (2006.01)
*H01L 23/498* (2006.01)

(52) U.S. Cl.
CPC ............. *G09G 3/20* (2013.01); *H01L 23/498* (2013.01); *H01L 24/17* (2013.01); *H01L 27/1214* (2013.01); *H05K 1/18* (2013.01); *H05K 3/323* (2013.01); *G09G 2300/04* (2013.01); *G09G 2310/0264* (2013.01); *H01L 24/16* (2013.01); *H01L 24/29* (2013.01); *H01L 24/32* (2013.01); *H01L 24/73* (2013.01); *H01L 2224/16225* (2013.01); *H01L 2224/16235* (2013.01); *H01L 2224/2919* (2013.01); *H01L 2224/73204* (2013.01); *H01L 2924/00014* (2013.01); *H01L 2924/14* (2013.01); *H01L 2924/15173* (2013.01); *H05K 2201/10128* (2013.01)

(58) Field of Classification Search
CPC ......... G09G 3/20; H01L 23/498; H01L 24/17; H01L 27/1214; H05K 1/18; H05K 3/323
USPC ........ 257/734, 730, 735, 737; 438/411, 461, 438/611
See application file for complete search history.

(56) References Cited

U.S. PATENT DOCUMENTS

| 2006/0022969 A1* | 2/2006 | Lee et al. ......... G02F 1/136286 345/211 |
| 2008/0284968 A1 | 11/2008 | Hwang et al. |

* cited by examiner

*Primary Examiner* — Thinh T Nguyen
(74) *Attorney, Agent, or Firm* — Fenwick & West LLP

(57) ABSTRACT

Disclosed herein is a chip-on-film including: a base film; a driver mounted on one of upper and lower surfaces of the base film; and at least one pad group, which includes signal wiring lines disposed on the upper and lower surfaces of the base film and transmitting signals via two paths, a first pad and a second pad disposed on one of the upper and lower surfaces of the base film, and a plurality of through-holes disposed between the first pad and the second pad and electrically connecting the signal wiring lines to each other, wherein the first pad and the second pad are separated a predetermined distance from each other in a width direction of the base film, and each of the first pad and the second pad is obliquely arranged in plural in a longitudinal direction of the base film.

10 Claims, 11 Drawing Sheets

CHIP-ON-FILM AND DISPLAY INCLUDING THE SAME

CROSS-REFERENCE TO RELATED APPLICATIONS

This application is divisional of U.S. patent application Ser. No. 16/155,705 filed on Oct. 9, 2018 which claims priority to Republic of Korea Patent Application No. 10-2017-0182520 filed on Dec. 28, 2017 in the Korean Intellectual Property Office, each of which is hereby incorporated by reference in its entirety.

BACKGROUND

Technical Field

The present disclosure relates to a chip-on-film (COF) capable of reducing the area thereof and a display including the same.

Description of the Related Art

Flat panel displays are applied to various applications to reduce the weight and volume of the applications. As the current society enters into a full-fledged information age, rapid development has been made in the field of displays visually displaying electrical signals. Thus, various displays have been developed and marketed. For example, various displays, such as liquid crystal displays, organic light emitting displays, electrophoretic displays, and quantum dot displays, are used, and are applied not only to small-size household appliances, such as mobile phones and tablets, but also to large-area TVs.

A display includes a display panel including a plurality of pixels defined by a plurality of gate lines and a plurality of data lines; a switching device and a display device which are arranged in each pixel; a gate driver driving the switching device by applying scanning signals via the gate lines; a data driver providing image signals through the switching device via the data lines; a timing controller providing various control signals to the gate driver and the data driver; and a gamma voltage generator generating a reference gamma voltage and providing the reference gamma voltage to the data driver.

The gate driver can be directly mounted in a non-display region of the display panel in order to reduce the volume and manufacturing costs of the display, and plural data drivers are mainly provided to a chip-on-film (COF), which in turn is attached to the display panel, to provide image signals.

However, displays including such a COF can suffer from the following problems. As displays have been fabricated to have larger areas and higher resolution, the numbers of gate lines and data lines formed on display panels are significantly increased. In addition, since there is a limit in the area of a COF in which data drivers providing image signals to data lines are mounted, there is a limit in formation of signal wiring lines in the COF corresponding to a large number of data lines.

BRIEF SUMMARY

Embodiments relate to a chip-on-film that includes a base film comprising a first surface and a second surface at an opposite side of the base film. The base film is formed with first through-holes and second through-holes. A driver chip is mounted on the first surface. The second through-holes are closer to the driver chip than the first through-holes in a longitudinal direction of the chip-on-film. Pad groups are on the second surface. The pad groups include a first set of pads and a second set of pads. A first set of signal wiring lines is on the first surface or the second surface to electrically connect the first set of pads to the driver chip via the first through-holes. A second set of signal wiring lines is on the first surface or the second surface to electrically connect the second set of pads to the driver chip via the second through-holes.

In one or more embodiments of the chip-on-film, at least one of the first set of pads and the second set of pads is arranged along a width direction of the base film with the first and second sets of pads extending in the longitudinal direction.

In one or more embodiments of the chip-on-film, the first set of pads is separated from the second set of pads by a predetermined distance in the longitudinal direction, and the first set of pads and the second set of pads are placed along the width direction in a staggered manner.

In one or more embodiments of the chip-on-film, portions of the first set of the signal wiring lines are connected to the first set of pads. The first set of the signal wiring lines extend parallel to a direction in which the first set of pads extend, and portions of the second set of the signal wiring lines connected to the second set of pads extend parallel to the same direction.

In one or more embodiments of the chip-on-film, the first set of pads is arranged along the longitudinal direction of the base film. Each of the first set of pads extends in a width direction and are offset from an adjacent pad in the width direction by a predetermined distance.

In one or more embodiments of the chip-on-film, portions of the first set of signal wiring lines connected to the first set of pads and portions of the second set of signal wiring lines connected to the second set of pads extend perpendicular to a direction in which the first and second sets of pads extend.

In one or more embodiments of the chip-on-film, connection wiring lines are disposed inside of the through holes, and through-hole pads are formed around the through-holes.

In one or more embodiments of the chip-on-film, the through-hole pads are separated from each other by a distance in a longitudinal direction of the base film and offset from each other in a width direction of the base film.

In one or more embodiments of the chip-on-film, the through-hole pads are offset from each other in the longitudinal direction of the base film and separated from each other by a distance in a width direction of the base film.

In one or more embodiments of the chip-on-film, a protective layer is disposed on the second surface of the base film except a region between the first set of pads and the second set of pads.

In one or more embodiments of the chip-on-film, each of the first and second sets of pads has a trapezoidal or triangular shape.

In one or more embodiments of the chip-on-film, the driver chip is a semiconductor integrated circuit (IC) chip.

In one or more embodiments of the chip-on-film, the pad group is configured to electrically connect to a display panel or a printed circuit board.

Embodiments also relate to a chip-on-film that includes a base film comprising a first surface and a second surface at an opposite side of the base film. The base film is formed with first through-holes and second through-holes. A driver chip is mounted on the first surface. First pads are aligned on the second surface. Second pads are aligned on the second surface and separated from the first set of pads. First signal wiring lines are on the second surface and are configured to connect the first pads to the driver chip via the first through-holes. First signal wiring lines connect the second pads to the driver chip via the second through-holes.

In one or more embodiments of the chip-on-film, the first pads and the second pads are placed along a first direction of the chip-on-film in a staggered manner.

In one or more embodiments of the chip-on-film, the first and second pads extend in a second direction perpendicular to the first direction.

In one or more embodiments of the chip-on-film, the first pads are spaced apart in a first direction and offset in a second direction perpendicular to the first direction. Ends of the second pads face corresponding ends of the first pads.

In one or more embodiments of the chip-on-film, the first and second pads extend in the second direction.

In one or more embodiments of the chip-on-film, the chip-on-film includes second signal wiring lines on the first surface. The second signal wirings connect the first and second through-holes to the driver chip.

Embodiments also relate to a display that includes a display panel comprising a display region for displaying images and a pad region outside the display region. The display also includes a chip-on-film. The chip on film includes a base film comprising a first surface and a second surface at an opposite side of the base film. The base film is formed with first through-holes and second through-holes. A driver chip is mounted on the first surface. First pads are aligned on the second surface and connected to the pad region of the display panel. Second pads are aligned on the second surface and separated from the first set of pads. The second pads are connected to the display region of the display panel. Signal wiring lines are on the second surface. The signal wiring lines connect the first pads to the driver chip via the first through-holes and connect the second pads to the driver chip via the second through-holes.

BRIEF DESCRIPTION OF THE DRAWINGS

The above and other aspects, features and advantages of the disclosure will become apparent from the following description of exemplary embodiments given in conjunction with the accompanying drawings.

DETAILED DESCRIPTION

Figure 1:
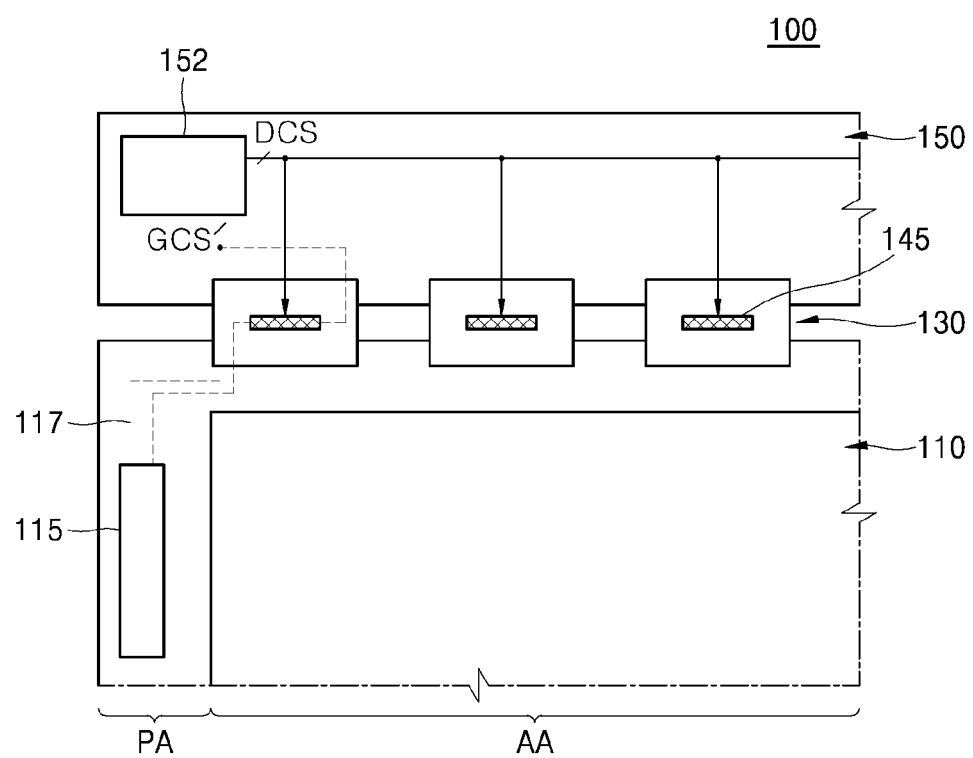
FIG. 1 is a partial plan view of a display including a COF attached thereto, according to a first embodiment of the present disclosure.

Hereinafter, exemplary embodiments of the present disclosure will be described in detail with reference to the accompanying drawings. It should be understood that the present disclosure is not limited to the following embodiments and may be embodied in different ways, and that the embodiments are given to provide complete disclosure and to provide thorough understanding of the present disclosure to those skilled in the art. The scope of the present disclosure is limited only by the accompanying claims and equivalents thereof.

In the drawings, the shapes, sizes, ratios, angles, and the number of components are provided for illustration only and do not limit the scope of the present disclosure. The same components will be denoted by the same reference numerals throughout the specification. Detailed description of known functions and constructions which can unnecessarily obscure the subject matter of the present disclosure will be omitted. The terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups there. As used herein, the singular forms "a", "an" and "the" are intended to include the plural forms as well, unless the context clearly indicates otherwise.

Unless stated otherwise, a margin of error is considered in analysis of components In description with spatially relative terms, for example, when an element is referred to as being disposed "on," "above," "below," or "beside" another element or layer, the element can be directly "on," "above," "below," or "beside" the other element or intervening elements may be present, unless stated otherwise.

In description of operations with temporal terms, for example, "after," "subsequent to," "before," or "followed by", the operations may be continuously or discontinuously performed, unless stated otherwise.

Although the terms "first", "second", "A", "B", etc. may be used herein to describe various elements, components and/or regions, these elements, elements, components and/or regions should not be limited by these terms. These terms are only used to distinguish one element, component or region from another element, component or region. Thus, a "first" element or component discussed below could also be termed a "second" element or component, or vice versa, without departing from the scope of the present disclosure.

Features of various embodiments of the present disclosure can be partially or entirely coupled to or combined with each other to realize various technical associations and operations and can be realized independently of each other or in association with each other.

Figure 2:
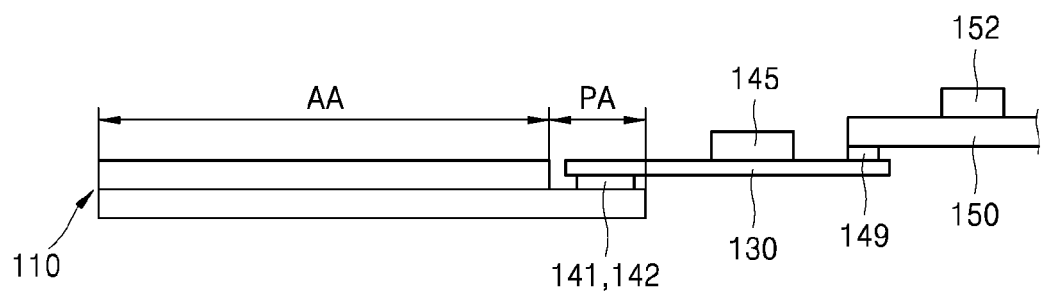
FIG. 2 is a partial sectional view of the display according to the first embodiment of the present disclosure.

FIG. 1 is a partial plan view of a display including a COF attached thereto, according to the present disclosure and FIG. 2 is a partial sectional view of the display.

Referring to FIGS. 1 and 2, a display 100 according to the present disclosure includes a display panel 110 on which an actual image is realized, and a COF 130 attached at one side thereof to a pad region of the display panel 110 and at the other side to a printed circuit board (PCB) 150.

The display panel 110 may include various display panels. For example, the display panel 110 may include various display panels, such as liquid crystal display panels, organic light emitting display panels, electrophoretic display panels, and quantum dot display panels.

A plurality of gate lines and a plurality of data lines may be arranged in a display region AA of the display panel 110 to define a plurality of pixels, each of which may include a switching device and a display device. The switching device may be a thin film transistor and the display device may be a liquid crystal layer, an organic light emitting layer, an electrophoretic layer, or a quantum dot device, without being limited thereto.

A gate driver 115 is mounted in a pad region PA on a left side of the display panel 110. In response to a gate control signal input from outside, the gate driver 115 generates and supplies a scanning signal to the gate lines in the display region AA. The gate driver 115 may be fabricated in the form of a semiconductor integrated circuit (IC) chip and mounted in the pad region PA of the display panel 110 (chip on glass), or may have a gate-in-panel (GIP) structure in which various devices such as thin film transistors are formed in the pad region PA.

The COF 130 is attached to the pad region PA on an upper side of the display panel 110 and a data driver 145 is mounted on the COF 130 to supply image data to the data lines of the display region AA in response to a data control signal input from outside. The COF 130 is formed with pads, which are electrically connected to pads of the display panel 110 and pads of the PCB 150. In addition, signal wiring lines are formed on upper and lower surfaces of the COF 130 to send a signal from the PCB150 to the data driver 145 and to send a signal from the data driver 145 to the data lines of the display panel 110.

The PCB 150 includes a timing controller 152. The timing controller 152 aligns an image signal input from outside such that the image signal corresponds to the size and resolution of the display panel 110, and supplies the image signal to a plurality of data drivers 145 mounted on a plurality of COFs 130, respectively. In addition, the timing controller 152 generates a plurality of gate control signals GCS and data control signals DCS using synchronizing signals such as a dot clock, data enable signals, horizontal synchronizing signals, vertical synchronizing signals, and the like, and supplies the plurality of gate control signals GCS and data control signals DCS to the data driver 145.

The PCB 150 may be configured in various forms. For example, the PCB 150 may be formed by stacking at least one layer of copper foil on one or both surfaces of a base substrate including an epoxy resin or the like, or by stacking at least one layer of copper foil on one or both surfaces of a flexible plastic film. In addition, the PCB 150 may be formed in a multilayer structure in which copper foil is formed inside the base substrate.

A separate signal wiring line not passing through the data driver 145 is formed in one COF 130 among the COFs 130 attached to the pad region PA on the upper side of the display panel 110, and an auxiliary wiring line 117 connected to the separate signal wiring line is formed in the pad region PA of the display panel 110, whereby a signal output from the timing controller 152 can be directly supplied to the gate driver 115 via the signal wiring line of the COF 130 and the auxiliary wiring line 117 of the display panel 110. In this structure, the auxiliary wiring line 117 is directly formed on a substrate of the display panel 110 and may be referred to as a line on glass (LOG).

The COF 130 is connected to the display panel 110 via output pads 141, 142, also referred to as a first pad 141 and a second pad 142, formed on the lower surface of the COF 130 and is connected to the PCB 150 via an input pad 149 formed on the upper surface of the COF 130. The output pads 141, 142 and the input pad 149 each include a conductive attachment member such as an anisotropic conductive film, and thus are electrically connected to the pads of the display panel 110 and the pads of the PCB 150. This will be described in detail with reference to FIG. 3.

Figure 3:
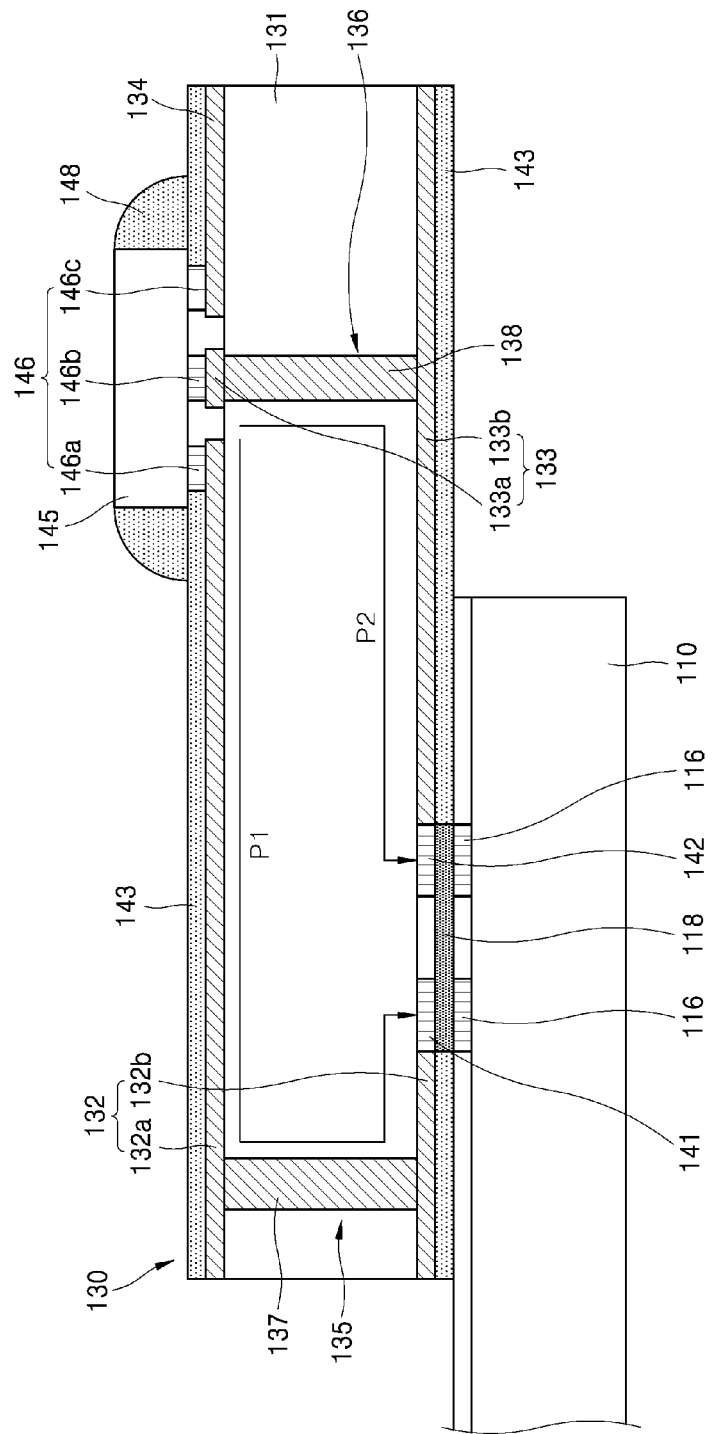
FIG. 3 is a sectional view of the COF according to the first embodiment of the present disclosure.

FIG. 3 is a diagram illustrating a structure of the COF (130) according to a first embodiment of the present disclosure and an attachment structure to the display panel 110.

Referring to FIG. 3, the COF 130 according to the first embodiment includes: a base film 131; signal wiring lines 132, 133, 134 formed on upper and lower surfaces of the base film 131; a first through-hole 135 and a second through-hole 136, which are formed in the base film 131 and connect the upper and lower surfaces of the base film 131 to each other; a first connection wiring line 137 and a second wiring line 138, which electrically connect the signal wiring lines 132, 133 through the first and second through-holes 135, 136, the signal wiring lines 132, 133 being formed on the upper and lower surfaces of the base film 131; and a first pad 141 and a second pad 142, which are formed on the lower surface of the COF 130 and are electrically connected to the signal wiring lines.

The lower surface of the COF 130 is attached at one side thereof to the pad region of the display panel 110, the data driver 145 is mounted on the upper surface of the COF 130, and the first and second pads 141, 142 electrically connected to the display panel 110 are formed on the lower surface of the COF 130.

The base film 131 includes a flexible plastic material, such as a polyimide or polyamide resin, and the signal wiring lines 132, 133, 134 include a metal having good conductivity, such as copper (Cu), without being limited thereto.

The signal wiring lines 132, 133, 134 include: an input wiring line 134 inputting, to the data driver 145, various signals output from the timing controller 152 of the PCB 150; and a first set of signal wiring lines 132 and a second signal wiring line 133, which output signals generated from the data driver 145 to the display panel 110.

The input wiring line 134 is formed on the upper surface of the base film 131 and electrically connects the COF 130 to the PCB 150.

The first set of signal wiring lines 132 includes a first upper signal wiring line 132a formed on the upper surface of the base film 131 and a first lower signal wiring line 132b formed on the lower surface of the base film 131, in which the first upper signal wiring line 132a is electrically connected to the first lower signal wiring line 132b by the first connection wiring line 137 formed in the first through-hole 135.

The second set of signal wiring lines 133 includes a second upper signal wiring line 133a formed on the upper surface of the base film 131 and a second lower signal wiring line 133b formed on the lower surface of the base film 131, in which the second upper signal wiring line 133a is electrically connected to the second lower signal wiring line 133b by the second connection wiring line 138 formed in the second through-hole 136.

The first pad 141 and the second pad 142, which are formed on the lower surface of the COF 130, are connected to the first lower signal wiring line 132b and the second lower signal wiring line 133b, respectively. The first pad 141 and the second pad 142 are connected to pads 116 of the display panel 11 by a conductive film 118 such as an anisotropic conductive film, respectively, and supply various signals output from the data driver 145 to the display panel 110.

The data driver 145, which takes the form of a semiconductor IC chip and is mounted on the upper surface of the COF 130, includes a plurality of bumps 146 connected to a plurality of input and output terminals. The plurality of bumps 146 includes a first bump 146a, a second bump 146b, and a third bump 146c. The first bump 146a of the data driver 145 is connected to the first upper signal wiring line 132*a* and the first lower signal wiring line 132*b* is connected to the first pad 141 such that the first bump 146*a* of the data driver 145 is electrically connected to the pads 116 of the display panel 110 via the first set of signal wiring lines 132.

The second bump 146*b* of the data driver 145 is connected to second upper signal wiring line 133*a* and the second lower signal wiring line 133*b* is connected to the second pad 142, such that the second bump 146*b* of the data driver 145 is electrically connected to the pads 116 of the display panel 110 via the second set of signal wiring lines 133.

The third bump 146*c* of the data driver 145 is connected to the input wiring line 134 and the input wiring line 134 is connected to the PCB, such that the third bump 146*c* of the data driver 145 is electrically connected to the PCB via the input wiring line 134.

Therefore, according to the present disclosure, a signal supplied from the PCB is input to the data driver 145 via the input wiring line 134, and a signal output from the data driver 145 is supplied to the display panel 110 via the first set of signal wiring lines 132 and the second set of signal wiring lines 133. Therefore, according to the present disclosure, the signal output from the data driver 145 is supplied to the display panel 110 via two paths P1, P2.

A protective layer 143 is disposed on each of the upper and lower surfaces of the base film 131 and protects a metal layer which forms the signal wiring lines 132, 133, 134 exposed to an outside thereof. With this structure, the protective layer 143 may include a photo-solder resist, without being limited thereto. Although the protective layers 143 are formed over the entire upper and lower surfaces of the COF 130, the protective layers 143 may be partially removed from a region of the upper surface for mounting the data driver 145 and from regions of the lower surface for forming the first pad 141 and the second pad 142 to expose portions of the signal wiring lines 132, 133, 134 and the first and second pads 141, 142 are exposed to the outside, such that the bumps 146 of the data driver 145 are connected to the exposed signal wiring lines 132, 133, 134, and the pads 116 of the display panel 110 are connected to the exposed first and second pads 141, 142.

In addition, the data driver 145 mounted on the upper surface of the COF 130 is sealed by a sealant 148. The sealant 148 may include one of acrylic, epoxy, silicone, and rubbery resins, or combinations thereof.

Although FIG. 3 illustrates that the first pad 141 and the second pad 142 are formed on the lower surface of the COF 130, the first pad 141 and the second pad 142 may be formed on the upper surface of the COF 130. In addition, although FIG. 3 illustrates that the data driver 145 is mounted on the upper surface of the COF 130, the data driver 145 may be mounted on the lower surface of the COF 130.

Figure 4:
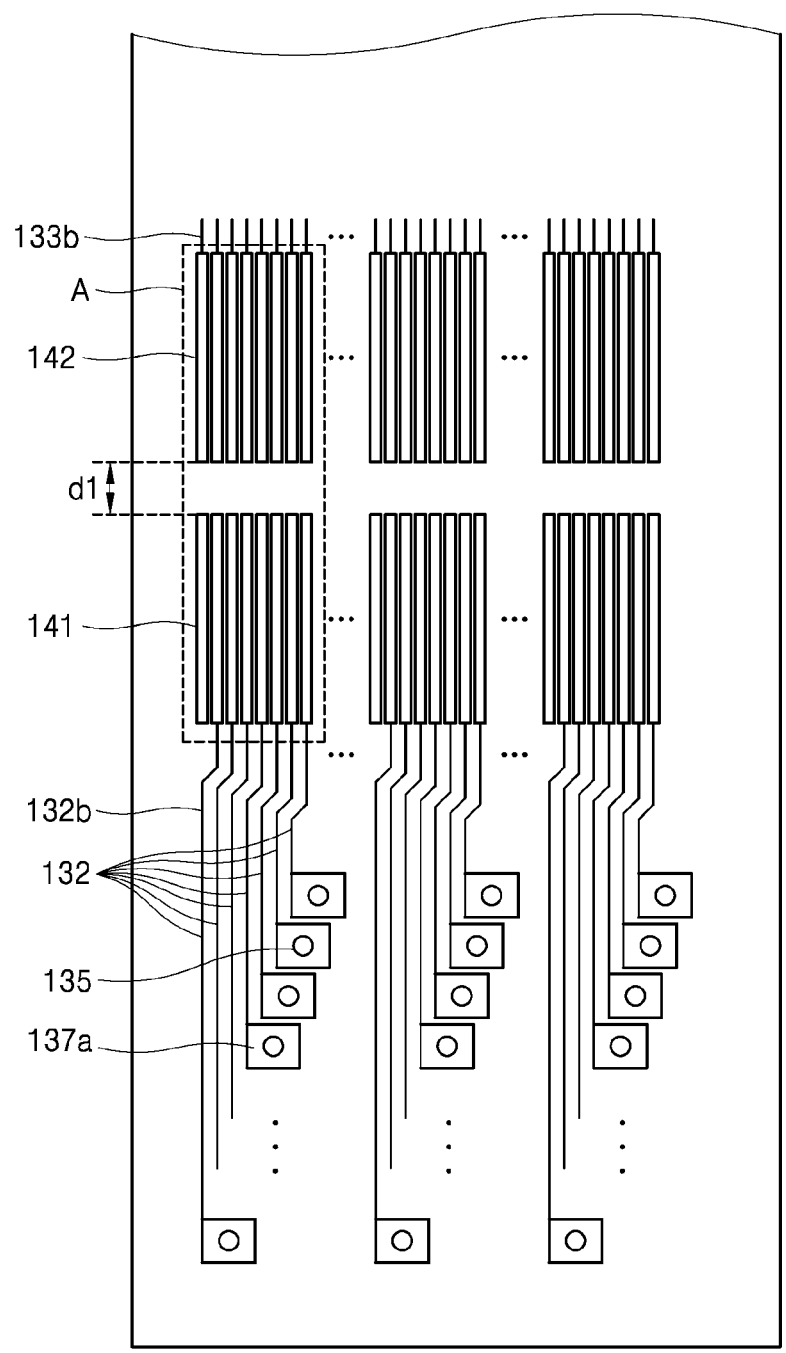
FIG. 4 is a partial rear view of the COF according to the first embodiment of the present disclosure.

FIG. 4 is a partial rear view of the COF 130 according to the first embodiment and illustrates the first pad 141, which is part of a first set of pads, the second pad 142, which is part of a second set of pads, the first set of signal wiring lines 132, the second set of signal wiring lines 133, and the first through-hole 135.

As shown in FIG. 4, each of the first pad 141 and the second pad 142 of the COF 130 is formed on the COF 130 extending in the longitudinal direction of the COF 130, and arranged along a width direction of the COF 130. The first set of pads is connected to the first set of signal wiring lines 132 in one-to-one correspondence, and the second set of pads is connected to the second set of signal wiring lines 133 in one-to-one correspondence. The first pad 141 and the second pad 142 are separated by a distance d1 in the longitudinal direction of the COF 130 and are connected to the pads 116 of the display panel 110.

The first lower signal wiring line 132*b* is electrically connected to the first connection wiring line 137 formed in the first through-hole 135. As shown in FIG. 4, a through-hole pad 137*a* formed by extending the first connection wiring line 137 is arranged around each first through-hole 135 in a rear surface of the COF 130, and is connected to the first lower signal wiring line 132*b* such that the first lower signal wiring line 132*b* is connected to the first connection wiring line 137. In addition, a through-hole pad may also be formed on the upper surface of the COF 130 and electrically connected to the first upper signal wiring line 132*a*.

Since the through-hole pad 137*a* has a greater width than the first lower signal wiring line 132*b*, if through-hole pads 137*a* are arranged in a row in the width direction of the COF 130 like the first lower signal wiring line 132*b*, adjacent through-hole pads 137*a* overlap each other, thereby causing short circuits between first lower signal wiring lines 132*b* and between the first lower signal wiring lines 132*b* and the pads 116 in the display panel 110.

When a plurality of through-hole pads 137*a* is arranged in a row in the width direction of the COF 130 to be separated a predetermined distance from each other, an interval between the first lower signal wiring lines 132*b* connected to the through-hole pads 137*a* becomes too wide. Thus to prevent a short circuit, the width of the COF 130 is required to be increased or the number of first lower signal wiring lines 132*b* formed in the COF 130 is required to be reduced. If the width of the COF 130 is increased, a problem can occur in that the total width of the plural COFs 130 attached to the display panel 110 are greater than the width of the display panel 110, and, among the pads 116 of the display panel 110, some pads 116 can be disconnected from the first lower signal wiring line 132*b* of each of the plural COFs 130. In other words, signals cannot be applied to some pads 116 of the display panel 110. In addition, since the interval between the first lower signal wiring lines 132*b* becomes too wide, there is a problem in that the COF 130 is not applicable to a high-resolution display.

In this embodiment, in order to solve the problems set forth above, the plurality of through-hole pads 137*a* are offset from each other in the width direction of the COF 130 and separated from each other by a distance in the longitudinal direction of the COF 130. Here, the through-hole pads 137*a* are arranged at an oblique angle such that the through-hole pads 137*a* are separated a predetermined distance from each other in the longitudinal direction of the COF 130 while offset from each other in the width direction of the COF 130. Each through-hole pad 137*a* is connected to the first lower signal wiring line 132*b*.

In this structure, a separation distance between the through-hole pads 137*a* in the width direction of the COF 130 is similar to an interval between the first lower signal wiring lines 132*b*. Thus, although increases in the width of the COF 130 can be prevented as there is no need to increase the interval between the first lower signal wiring lines 132*b*, the length of the COF 130 is increased, since the through-hole pads 137*a* are formed in the longitudinal direction of the COF 130. However, since increases in length of the COF 130 does not cause a problem in application of signals and in application of the COF 130 to a high-resolution display, the COF 130 can be applied to a high-resolution display.

Figure 5:
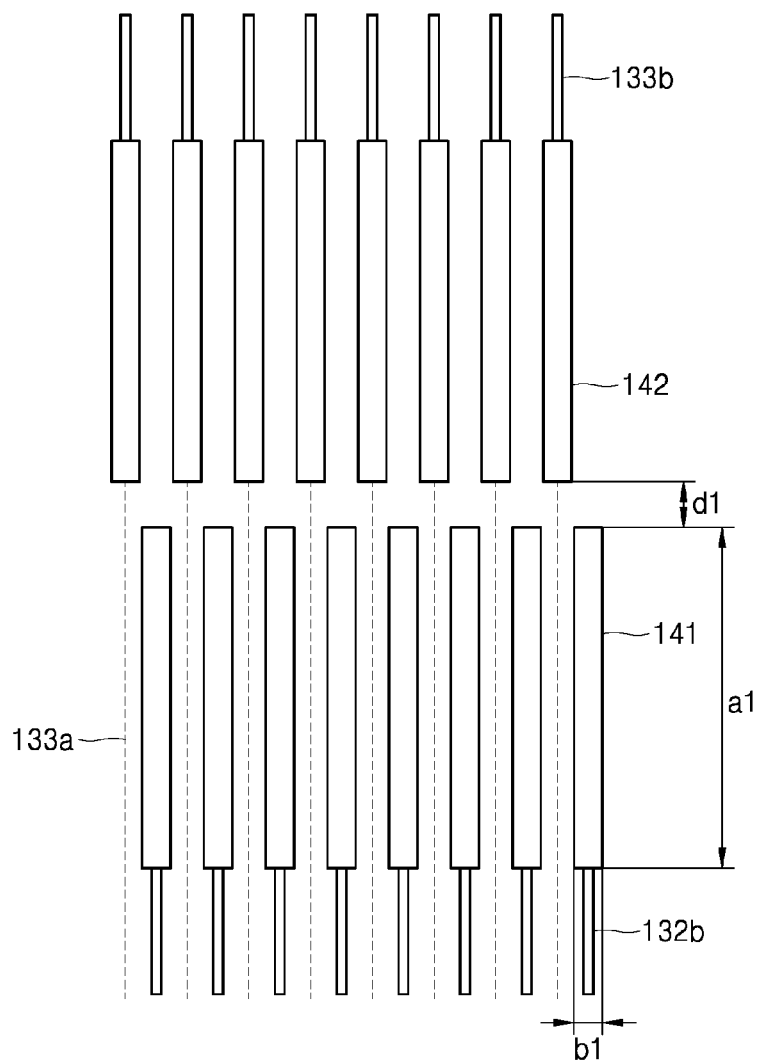
FIG. 5 is a partially enlarged view of Region A of FIG. 4.

FIG. 5 is an enlarged view of an area A of FIG. 4 and illustrates structures of the pads 141, 142 and the signal wiring lines 132, 133, which are arranged on the lower surface of the COF 130.

Referring to FIG. 5, the first pad 141 and the second pad 142 are disposed on the lower surface of the COF 130 with a distance d1 separating them in the longitudinal direction of the COF 130, and the plurality of first pads 141 and the plurality of second pads 142 are placed along the width direction of the COF 130, in a staggered manner. The first upper signal wiring line 132a and the first lower signal wiring line 132b are connected to the first pad 141, and the second upper signal wiring line 133a and the second lower signal wiring line 133b are connected to the second pad 142.

Although the first pad 141 and the second pad 142 may be disposed at the same location to face each other in the longitudinal direction of the COF 130, the second pad 142 may be disposed in a region corresponding to a space between the first pads 141, and the first pad 141 may be disposed in a region corresponding to a space between the second pads 142. Although the first pad 141 and the second pad 142 may have the same length a1 and width b1, the first pad 141 and the second pad 142 may have different lengths and widths from each other depending upon shapes of the pads 116 of the display panel 110, to which the COF 130 is attached.

As described above, in this embodiment, the first set of signal wiring lines 132 and the second set of signal wiring lines 133 are formed on the upper and lower surfaces of the COF 130, whereby signals are applied from the data driver 145 to the display panel 110 using the two paths P1, P2. Therefore, since the COF 130 can include twice the number of signal wiring lines as compared with a COF having a structure in which signals are applied using a signal wiring line formed only on one surface thereof, the area of the COF 130 can be reduced. In addition, since the COF 130 can include denser signal wiring lines in the same area than a COF having a general structure, the COF 130 can be applied to a high-resolution display.

Figure 6:
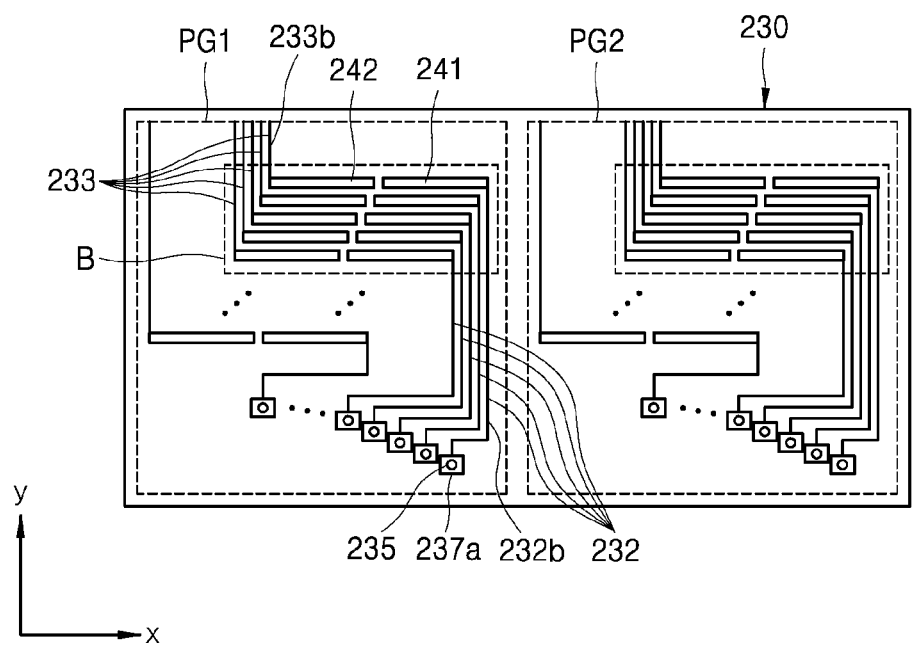
FIG. 6 is a partial rear view of a COF according to a second embodiment of the present disclosure.

FIG. 6 is a rear view of a COF 230 according to a second embodiment of the present disclosure and illustrates structures of first pads 241, which are part of a first set of pads, and second pads 242, which are part of a second set of pads, a first set of signal wiring lines 232, a second set of signal wiring lines 233, and a plurality of first through-holes 235, which are arranged on a lower surface of the COF 230. Since the COF 230 according to this embodiment has a similar structure to that of the first embodiment except for the first pads 241, second pads 242, first signal wiring lines 232, and the second signal wiring lines 233, repeated description will be omitted or briefly made, and only different features will be described in detail.

Referring to FIG. 6, in this embodiment, the first pad 241 and the second pad 242 have preset lengths and are disposed on the lower surface of the COF 230 extending in the width direction of the COF 230. The first pad 241 and the second pad 242 are disposed at the same location to face each other. In addition, the first pads 241 and of the second pads 242 are each arranged at a preset interval in the longitudinal direction of the COF 230. Since each of the first pads 241 is offset from an adjacent first pad 241 by a certain distance in the width direction, the first pads 241 are obliquely arranged in the longitudinal direction. In addition, since each of the second pads 242 is also offset from an adjacent second pad 242 thereto by a certain distance in the width direction, the second pads 242 are obliquely arranged in the longitudinal direction.

The first pad 241 and the second pad 242 facing each other among the first pads 241 and the second pads 242, for example, a first-position pad of the first pads 241 and a first-position pad of the second pads 242, are separated a predetermined distance from each other in the width direction.

The first pads 241 is connected to first lower signal wiring lines 232b in one-to-one correspondence and the second pads 242 is connected to second lower signal wiring lines 233b in one-to-one correspondence. In addition, the first lower signal wiring lines 232b and the second lower signal wiring lines 233b are each connected to an output terminal of a data driver in one-to-one correspondence.

The first lower signal wiring line 232b and the second lower signal wiring line 233b are connected to ends not facing each other among both ends of the first pad 241 and both ends of the second pad 242, respectively, and are thus disposed farthest away from each other.

The plurality first lower signal wiring lines 232b and the plurality second lower signal wiring lines 233b are connected to the first pads 241 and the second pads 242, respectively. Portions of the first set of signal wiring lines 232 connected to the first set of pads extend perpendicular to the direction in which the first set of pads extend. Similarly, portions of the second set of signal wiring lines 233 connected to the second set of pads extend perpendicular to the direction in which the first set of pads extend.

Since the first pads 241 are arranged in the longitudinal direction while offset by a shift distance in the width direction and the plural second pads 242 are arranged in the longitudinal direction while offset by a shift distance in the width direction, the first lower signal wiring lines 232b connected to the first pads 241 are also arranged at the same interval as the shift distance between the first pads 241 in the width direction. The second lower signal wiring lines 233b connected to the second pads 242 are also arranged at the same interval as the shift distance between the second pads 242 in the width direction of the second pad 242.

The plurality of first through-holes 235 and a plurality of through-hole pads 237a are provided to the COF 230 and electrically connected to the first lower signal wiring lines 232b. The plurality of through-hole pads 237a are offset from each other in the longitudinal direction while being separated by a distance from each other in the width direction. Although the plurality of through-hole pads 237a are arranged at an oblique angle and thus separated from each other in the width direction, the plural through-hole pads 237a are offset from each other in the longitudinal direction. Thus, each of the through-hole pads 237a does not contact an adjacent through-hole pad 237a.

In the width direction, all of the through-hole pads 237a are arranged only inside a region in which the first pads 241 and the second pads 242 are formed, rather than outside the region. Thus, since a region in which the plurality of through-hole pads 237a are formed is smaller than a region in which the first pads 241, the second pads 242, and the first lower signal wiring lines 232b connected to the first pads 241 are formed, the width of the COF 230 is not increased due to an arrangement of the plurality of through-hole pads 237a.

The first pads 241 and the second pads 242 separated a predetermined distance from each other and having ends facing each other, the first lower signal wiring lines 232b and the second lower signal wiring lines 233b connected to the first pads 241 and the second pads 242, respectively, and the plurality of first through-holes 235 and the plurality of through-hole pads 237a connected to the first pads 241 and the second pads 242 form one pad group PG. Since a width of the pad group PG is equal to the width of the COF 230, only one pad group PG may be formed in the COF 230.

Alternatively, a plurality of pad groups PG may be arranged in the width direction of the COF 230, as needed.

In a structure of n pad groups PG, since m first pads 241, m second pads 242, m first lower signal wiring lines 232b, and m second lower signal wiring lines 233b are arranged in each pad group PG, 2m×n pads are arranged in a whole area of the COF 230.

Figure 7:
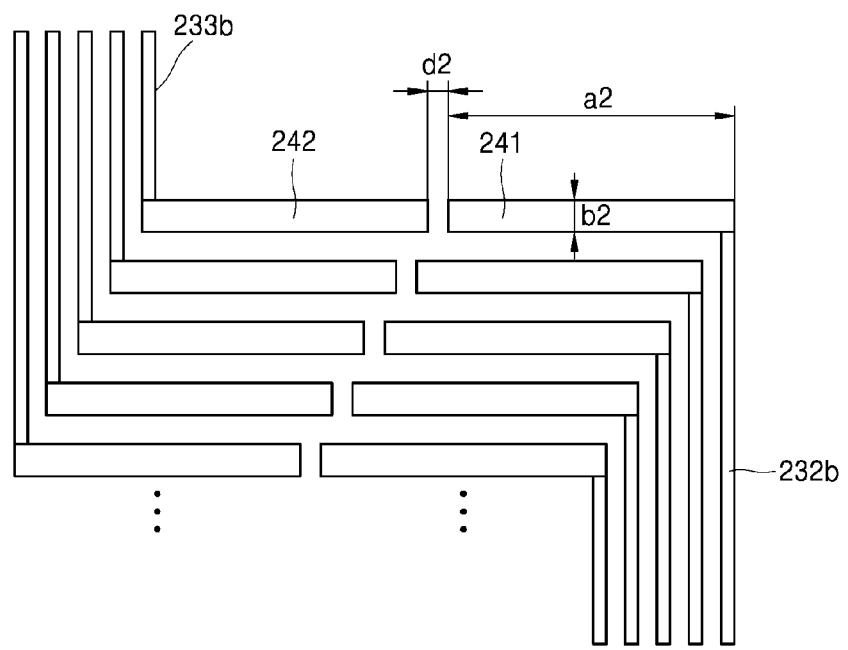
FIG. 7 is a partially enlarged view of Region B of FIG. 6.

FIG. 7 is an enlarged rear view of an area B of FIG. 6. Referring to FIG. 7, in the COF 230 according to this embodiment, the first pads 241 and the second pads 242, each of which has a preset length a2 and a preset width b2, are disposed extending in the width direction separated by a distance d2 in the width direction. Adjacent first pads 241 are offset from each other by a distance in the width direction. Adjacent second pads 242 are similarly offset from each other by a distance in the width direction.

In addition, the first pads 241 and the second pads 242 are each arranged in the longitudinal direction. Since each first pad 241 is separated by a distance from an adjacent first pad 241 in the longitudinal direction and each second pad 242 is separated by a distance from an adjacent second pad 242 in the longitudinal direction, the plural first pads 241 and the plural second pads 242 are each obliquely arranged in the longitudinal direction.

The first pads 241 and the second pads 242, which are each arranged along the longitudinal direction, face each other with a certain distance d2 there between. The first pads 241 and the second pads 242 are electrically connected to the pads 116 of the display panel 116, respectively. Thus, the first pad 241 and the second pad 242 may have the same width and length and may also have the same interval from an adjacent signal wiring line.

The plural first lower signal wiring lines 232b and the plural second lower signal wiring lines 233b are connected to the first pads 241 and the second pads 242, respectively, and are arranged in the longitudinal direction of the COF 230. Thus, the first pads 241 and the first lower signal wiring lines 232b extend perpendicular to each other, and the second pads 242 and the second lower signal wiring lines 233b extend perpendicular to each other.

As such, in the COF 230 of the second embodiment, since the first pad 241 and the second pad 242 are disposed in the width direction of the COF 230, and the first pads 241 and the plurality of second pads 241 are each obliquely arranged in the longitudinal direction thereof, the width of the COF 230 may be reduced as compared with that in the first embodiment, and this structure will be described in more detail as follows.

Figure 8:
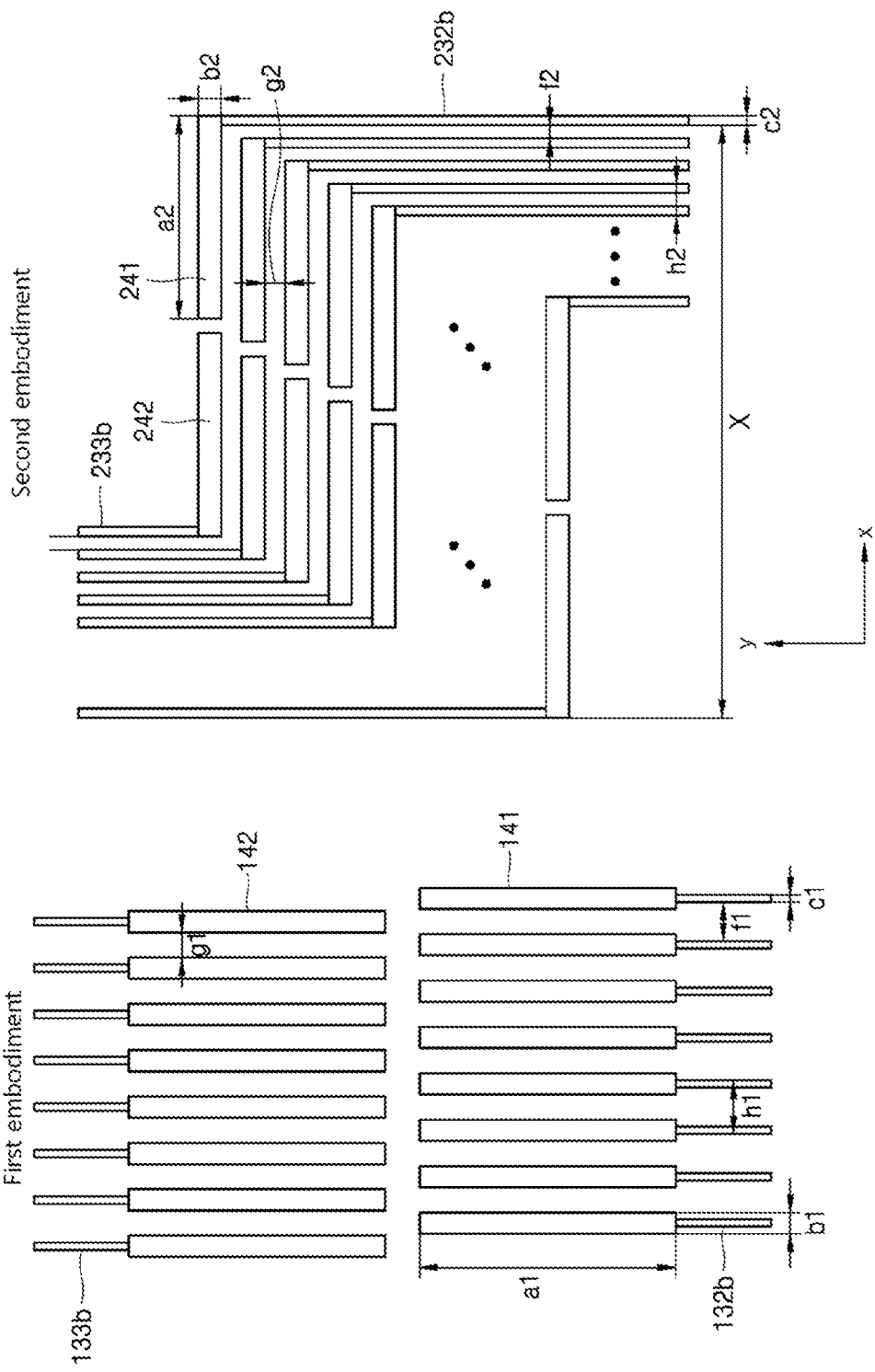
FIG. 8 is a plan view illustrating a difference between the COFs according to the first and second embodiments of the present disclosure.

FIG. 8 illustrates the COF 130 of the first embodiment and the COF 230 of the second embodiment, and shows the reason that the width of the COF 230 of the second embodiment is reduced as compared with the COF 130. In the COF 130 of the first embodiment and the COF 230 of the second embodiment, since the first pad and the second pad have the same shape and size, and the first signal wiring line and the second signal wiring line have the same shape and size, the following description will focus on the first pad and the first signal wiring line for convenience. However, it should be understood that the following description can also be applied to the second pad and the second signal wiring line.

As shown in FIG. 8, in the COF 130 of the first embodiment, the first pad 141 is disposed extending in the longitudinal direction and the first lower signal wiring line 132b is also disposed extending in the longitudinal direction. In this embodiment, each first pad 141 has a length of a1 and a width of b1. In addition, since each first lower signal wiring line 132b has a width of c1 and has an interval of f1 from an adjacent first lower signal wiring line 132b, the first lower signal wiring lines 132b has a pitch h1 obtained by h1=c1+f1. Here, a pitch of a plurality of wiring lines refers to a distance between a center of a width of one wiring line and a center of a width of another wiring line adjacent to the one wiring line.

In the COF 230 according to the second embodiment, the first pad 241 is disposed extending in the width direction and the first lower signal wiring line 232b is disposed extending in the longitudinal direction. In this embodiment, each first pad 241 has a length of a2 and a width of b2. In addition, since each first lower signal wiring line 232b has a width of c2 and has an interval of f2 from an adjacent first lower signal wiring line 232b, the first lower signal wiring lines 232b has a pitch h2 obtained by h2=c2+f2.

In the COF 130 according to the first embodiment, since the width b1 of each first pad 141 is greater than the width c1 of each first lower signal wiring line 132b (b1>c1), the interval f1 between the first lower signal wiring lines 132b is greater than an interval g1 between the first pads 141 (f1>g1).

The interval g1 between the first pads 141 is a critical interval causing no signal interference between the first pads 141. In addition, the interval f1 between the first lower signal wiring lines 132b is also a critical interval causing no signal interference between the first lower signal wiring lines 132b. As shown in FIG. 8, since the width b1 of each first pad 141 is greater than the width c1 of each first lower signal wiring line 132b (b1>c1), the interval g1 between the first pads 141 is required to be greater than the interval f1 between the first lower signal wiring lines 132b in order to remove signal interference.

However, in the first embodiment, since the first lower signal wiring line 132b is connected to the first pad 141, the interval f1 between the first lower signal wiring lines 132b is greater than the interval g1 between the first pads 141 and arrangement efficiency of the first lower signal wiring lines 132b is deteriorated. Thus, the area of a region occupied by the first lower signal wiring lines 132b is greater than an optimum area (area when the first lower signal wiring lines 132b are formed such that the interval between is the critical interval).

On the other hand, in the second embodiment, since the plural first pads 241 are arranged in the longitudinal direction whereas the first lower signal wiring lines 232b are arranged in the width direction, the interval f2 between the first lower signal wiring lines 232b and the interval g2 between the first pads 241 may be set without any relation to each other. Since the width c2 of each first lower signal wiring line 232b is less than the width b2 of each first pad 241, the interval f2 between the first lower signal wiring lines 232b may be set to less than the interval g2 between the first pads 241 (f2<g2).

Therefore, since the pitch h2 of the first lower signal wiring lines 232b of the second embodiment is less than the pitch h1 of the first lower signal wiring lines 132b of the first embodiment (h2<h1), the area of a region in which the first lower signal wiring lines 232b of the second embodiment are arranged in the width direction is less than the area of a region in which the first lower signal wiring lines 132b of the first embodiment are arranged in the width direction.

In the COF 230 of the second embodiment, since an arrangement area of the signal wiring lines 232, 233 can be reduced despite arrangement of the first pad 241 and the second pad 242 in the width direction, the width of the COF 230 of the second embodiment can be reduced as compared with the COF 130 of the first embodiment, or more pads 241, 242 and signal wiring lines 232, 233 can be arranged in the COF 230 having the same width than in the COF 130 of the first embodiment.

For example, in the first embodiment in which the COF 130 has a width of 45.836 mm (45836 µm), when the first pads 141 and the seconds pad 142 have a width b1 of 14 µm (b1=14 µm) and an interval g1 of 14 µm (g1=14 µm), each pitch h1 of the first lower signal wiring lines 132b and the second lower signal wiring lines 133b becomes equal to each pitch of the first pads 141 and the second pads 142. Thus, h1=28 µm. Therefore, in the first embodiment, about 1637 first pads 141 and about 1637 second pads 142 are arranged in the COF 130. Together this amounts to 3274 pads 141, 142 in total (1637×2) are arranged in the COF 130.

In the COF 230 of the second embodiment, since the first pad 241 and the second pad 242 are disposed extending in the width direction, although the interval between the first pads 241 does not cause influence in terms of the width direction, the length a2 of each of the first pad 241 and the second pad 242, and the interval d2 between the first pad 241 and the second pad 242 occupy certain regions of the COF 230 in the width direction.

In the COF 230, a length X of the pad group PG in the width direction varies depending upon the number of the first pads 241 and the number of the second pads 242 arranged in the pad group PG. Since the number of the first lower signal wiring lines 232b and the number of the second lower signal wiring lines 233b increase with increasing number of the first pads 241 and increasing number of the second pads 242, an arrangement region of the second lower signal wiring lines 233b increases in the width direction.

In a structure wherein the first pads 241 and the second pads 242 have a width b2 of 14 µm (b2=14 µm) and an interval g2 of 14 µm (g2=14 µm); wherein the first pad 241 and the second pad 242 each have a length a2 of 350 µm (a2=350 µm); wherein the interval d2 between the first pad 241 and the second pad 242 is 10 µm (d2=10 µm); and wherein the first lower signal wiring lines 232b and the second lower signal wiring lines 233b have a width c2 of 7 µm (c2=7 µm), an interval f2 of 10 µm (f2=10 µm), and a pitch h2 of 17 µm (h2=17 µm), the length X of the pad group PG is 7483 µm (X=7483 µm) when 400 first pads 241 and 400 second pads 242 are arranged in one pad group PG.

Therefore, in this case, since 6 pad groups PG can be arranged in the COF 230 in the width direction (458836 µm/7483 µm), and 800 pads 241, 242 are arranged in each pad group PG (400×2), 4800 pads 241, 242 in total are arranged in the COF 230 (800×6).

Since 3274 pads 141, 142 in total are arranged in the COF 130 in the first embodiment whereas 4800 pads 241, 242 in total are arranged in the COF 230 in the second embodiment, the COF 230 of the second embodiment allows a higher number of pads to be arranged thereon than the COF 130 of the first embodiment and thus can be applied to a high-resolution display. In addition, when the same number of pads is arranged, the area of the COF can be reduced in the second embodiment as compared with the first embodiment.

In the COF 230 of the second embodiment, when the number of the first pads 241 and the number of the second pads 242 arranged in the pad group PG are changed, the number of pad groups PG is changed. For example, when 200 first pads 241 and 200 second pads 242 are arranged in each pad group PG, since the length x of each pad group PG is 4083 µm (x=4083 µm), 11 pad groups PG are arranged in the COF 230. Thus, since 400 pads 241, 242 are arranged in each pad group PG (200×2), 4400 pads 241, 242 in total are arranged in the COF 230 (400×11). In this case, also, more pads 241, 242 can be arranged in the COF 230 of the second embodiment than in the first embodiment.

Therefore, in the COF 230 of the second embodiment, even though the numbers of the first pads 241 and the second pads 242 arranged in the pad group PG are changed and the number of pad groups PG is also changed corresponding thereto, the COF 230 can be reduced in width as compared with the COF 130 of the first embodiment or can include more pads arranged therein than the COF 130.

As such, in this embodiment, since the first pad 241 and the second pad 242 are disposed extending in the width direction of the COF 230 and the first pads 241 and the second pads 242 are each arranged in the longitudinal direction of the COF 230, the length of COF 230 increases with increasing numbers of the first pads 241 and the second pads 242 each arranged in the longitudinal direction, despite reduction in width of the COF 230 or arrangement of more of the first pads 241 and the first pads 242 in the same area.

Figure 9A:
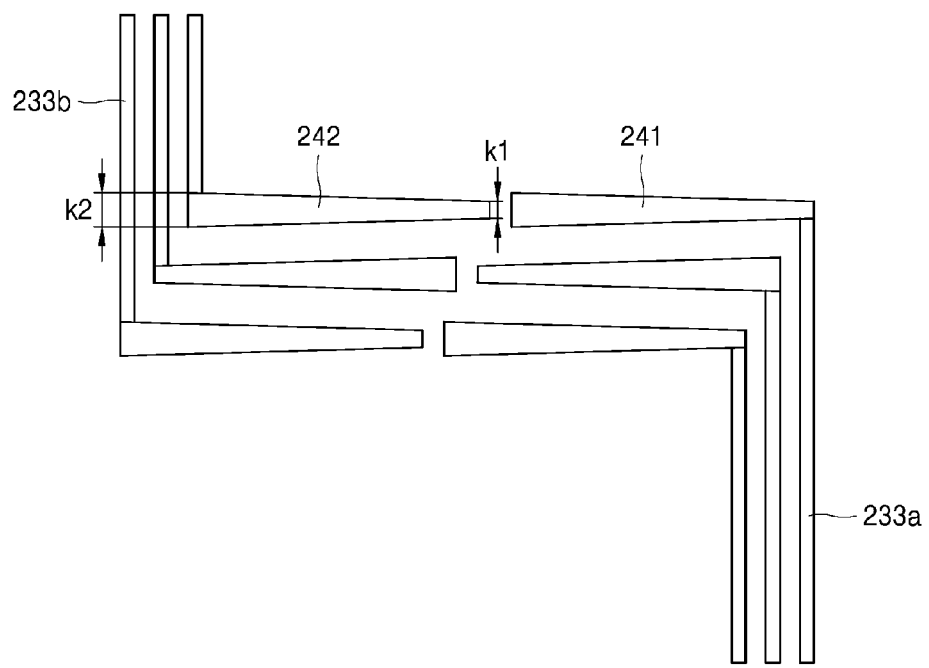
FIGS. 9A and 9B are diagrams illustrating other shapes of a pad of the COF according to the second embodiment of the present disclosure.
Figure 9B:
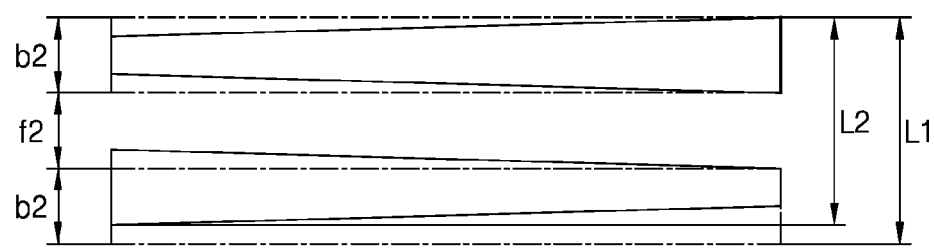

Therefore, according to another embodiment, increase in length of the COF 230 can be minimized by changing the shapes of the first pad 241 and the second pad 242, as shown in FIG. 9A and FIG. 9B.

As shown in FIG. 9A, the first pad 241 and the second pad 242 are disposed extending in the width direction of the COF 230 and have a trapezoidal shape instead of a rectangular shape, without being limited thereto. Since the first pads 241 arranged in the longitudinal direction and the second pads 242 arranged in the longitudinal direction are disposed such that a trapezoidal long side (long-side length: k2) of each first pad 241 is located in opposition to a trapezoidal short side (short-side length: k1) of each second pad 242, ends of the first pad 241 and ends of the second pads 242 are located corresponding to the long side, short side, long side, and short side, or to the short side, long side, short side, and long side, respectively.

Figure 10:
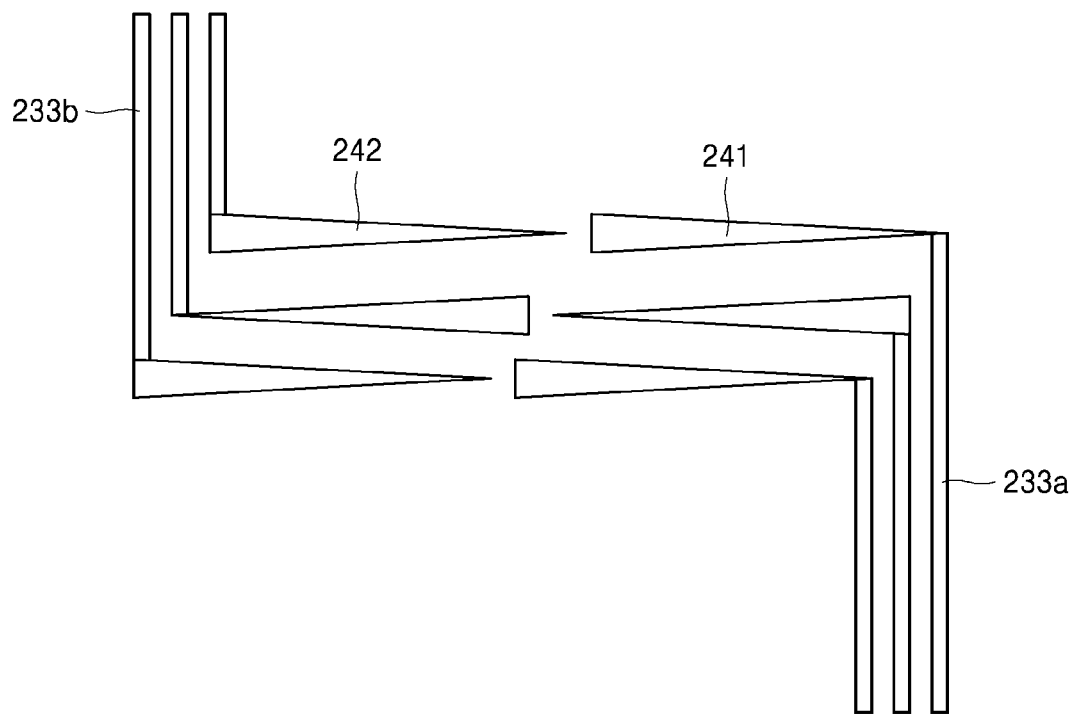
FIG. 10 is a diagram illustrating a triangular shaped pad of the COF according to an embodiment of the present disclosure

Further, the first pads 241 and the second pads 242 may each have a triangular shape, as shown in FIG. 10 and may be arranged such that a vertex of the triangular shape and a base thereof alternately repeat.

As shown in FIG. 9B, in the structure wherein the first pad 241 and the second pad 242 each have a rectangular shape (marked by a dashed-single-dotted line), due to the width b2 of the first pad 241 and the interval f2 between the first pads 241, an arrangement length L1 of two pads is obtained by L1=2×b2+f2, and, in the structure wherein the first pad 241 and the second pad 242 each have a trapezoidal shape, an arrangement length L2 of two pads is obtained by L2=3× b2/2+(b2−k2) (where b2>k2).

Therefore, the trapezoidal pad allows a length of about b2−(k2+(k1+k2)/2) to be reduced per two pads 241, 242, as compared with the rectangular pad. For example, when the first pad and the second pad are formed in a trapezoidal shape having k1=10 µm and k2=14 µm; the rectangular pad has a width b2 of 14 µm; and 400 first pads and 400 second pads 242 are arranged per pad group PG, since b2−(k2+(k1+k2)/2=−12, a length of (400/2)×(14−12)=400 µm can be reduced.

In addition, since the shape of each of the first pad 241 and the second pad 242 is changed from the rectangular shape to the trapezoidal shape, the area of each of the first pad 241 and the second pad 242 is reduced, thereby reducing a contact area when each of the first pad 241 and the second pad 242 is connected to a pad of the display panel. Therefore, to facilitate supply of signals to the display panel 210 by maintaining the preset contact area, the length of each of the first pad 241 and the second pad 242 needs to be increased to minimize a reduction in area thereof due to change in the shape of each of the first pad 241 and the second pad 242. In other words, the area of each of the first pad 241 and the second pad 242 needs to be increased by increasing the length thereof, and, in this case, the width of the COF 230 is increased.

However, since increase in the width of the COF 230 due to increase in the length of each of the first pad 241 and the second pad 242 is extremely insignificant as compared with the whole width of the COF 230, there is no substantial influence. For example, when the length of each of the first pad 241 and the second pad 242 is increased by 50 µm, an arrangement width of the first pad 241 and the second pad 242 in one pad group PG is increased by 100 µm. When the COF 230 includes 6 pad groups, and 400 first pads and 400 second pads are arranged in each pad group PG, each pad group PG has a width of 7483 µm. Thus, since an increase of 100 µm in the width of the pad group PG due to increase in the length of each of the first pad 241 and the second pad 242 is much smaller than the whole width of the pad group PG, the increase in the width of the COF 230 due to the increase in the length of each of the first pad 241 and the second pad 242 is insignificant. Therefore, due to change in the shape of each of the first pad 241 and the second pad 242, the width of the COF 230 is not significantly increased and the number of the pads 241, 242 arranged in the COF 230 is not significantly reduced.

As described above, in the COF 230 according to the second embodiment, the width of the COF 230 can be reduced by forming the signal wiring lines 232, 233 on the upper and lower surfaces of the COF 230, and can also be further reduced by placing the first pad 241 and the second pad 242 in the width direction of the COF 230.

In addition, the chip-on-film and the display according to the present disclosure may be applied to mobile devices, video phones, smart watches, watch phones, wearable devices, foldable devices, rollable devices, bendable devices, flexible devices, curved devices, electronic organizers, electronic books, portable multimedia players (PMPs), personal digital assistants (PDAs), MP3 players, mobile medical devices, desktop PCs, laptop PCs, netbook computers, workstations, navigation systems, vehicle navigation systems, vehicle displays, televisions, wallpaper displays, notebooks, monitors, cameras, camcorders, household appliances, and the like.

What is claimed is:

1. A chip-on-film comprising:
   a base film comprising a first surface and a second surface at an opposite side of the base film, the base film formed with first through-holes and second through-holes;
   a driver chip mounted on the first surface, the second through-holes closer to the driver chip than the first through-holes in a longitudinal direction of the chip-on-film;
   pad groups on the second surface, the pad groups comprising a first set of pads and a second set of pads;
   a first set of signal wiring lines on the first surface or the second surface to electrically connect the first set of pads to the driver chip via the first through-holes; and
   a second set of signal wiring lines on the first surface or the second surface to electrically connect the second set of pads to the driver chip via the second through-holes,
   wherein at least one of the first set of pads and the second set of pads is arranged along a width direction of the base film with the first set of pads and the second set of pads extending in the longitudinal direction.

2. The chip-on-film according to claim 1, wherein the first set of pads is separated from the second set of pads by a predetermined distance in the longitudinal direction, and wherein the first set of pads and the second set of pads are placed along the width direction in a staggered manner.

3. The chip-on-film according to claim 1, wherein portions of the first set of the signal wiring lines connected to the first set of pads extend parallel to a direction in which the first set of pads extend, and portions of the second set of the signal wiring lines connected to the second set of pads extend in the direction.

4. The chip-on-film according to claim 1, wherein connection wiring lines are disposed inside of the through holes, and through-hole pads are formed around the through-holes.

5. The chip-on-film according to claim 4, wherein the through-hole pads are separated from each other by a distance in a longitudinal direction of the base film and offset from each other in a width direction of the base film.

6. The chip-on-film according to claim 4, wherein the through-hole pads are offset from each other in the longitudinal direction of the base film and separated from each other by a distance in a width direction of the base film.

7. The chip-on-film according to claim 1, further comprising:
   a protective layer disposed on the second surface of the base film except a region between the first set of pads and the second set of pads.

8. The chip-on-film according to claim 1, wherein each of the first set of pads and the second sets of pad has a trapezoidal or triangular shape.

9. The chip-on-film according to claim 1, wherein the driver chip is a semiconductor integrated circuit (IC) chip.

10. The chip-on-film according to claim 1, wherein the pad groups are configured to electrically connect to a display panel or a printed circuit board.

* * * * *